United States Patent [19]
Zhang et al.

[11] Patent Number: 5,426,064
[45] Date of Patent: Jun. 20, 1995

[54] METHOD OF FABRICATING A SEMICONDUCTOR DEVICE

[75] Inventors: Hognyong Zhang; Hideki Uochi; Toru Takayama; Yasuhiko Takemura, all of Kanagawa, Japan

[73] Assignee: Semiconductor Energy Laboratory Co., Ltd., Kanagawa, Japan

[21] Appl. No.: 207,126

[22] Filed: Mar. 8, 1994

[30] Foreign Application Priority Data

Mar. 12, 1993 [JP] Japan .................. 5-079002

[51] Int. Cl.⁶ .......................... H01L 21/265
[52] U.S. Cl. ........................ 437/40; 437/233; 437/247; 437/913; 148/DIG. 16; 148/DIG. 150
[58] Field of Search ............... 437/40, 233, 913, 247; 148/DIG. 150, DIG. 16

[56] References Cited

U.S. PATENT DOCUMENTS 5,147,826  9/1992  Liu et al. ................ 437/233
5,275,851  3/1993  Fonash et al. ........... 437/233

Primary Examiner—Brian E. Hearn
Assistant Examiner—Michael Trinh
Attorney, Agent, or Firm—Sixbey, Friedman, Leedom & Ferguson; Gerald J. Ferguson, Jr.

[57] ABSTRACT

Method of fabricating a semiconductor device, such as a thin-film transistor, having improved characteristics and improved reliability. The method is initiated with formation of a thin amorphous silicon film on a substrate. A metallization layer containing at least one of nickel, iron, cobalt, and platinum is selectively formed on or under the amorphous silicon film so as to be in intimate contact with the silicon film, or these metal elements are added to the amorphous silicon film. The amorphous silicon film is thermally annealed to crystallize it. The surface of the obtained crystalline silicon film is etched to a depth of 20 to 200Å, thus producing a clean surface. An insulating film is formed on the clean surface by CVD or physical vapor deposition. Gate electrodes are formed on the insulating film.

26 Claims, 3 Drawing Sheets a: PRESENT INVENTION
b: PRIOR ART

METHOD OF FABRICATING A SEMICONDUCTOR DEVICE

FIELD OF THE INVENTION

The present invention relates to a method of fabricating a semiconductor device in the form of a thin film such as a thin-film transistor (TFT) or a thin-film diode and, more particularly, to a method of fabricating a semiconductor device using a crystalline semiconductor material. A semiconductor device fabricated according to the invention can be formed either on an insulating substrate made of glass or the like or on a semiconductor substrate made of a single crystal of silicon or the like.

BACKGROUND OF THE INVENTION

Thin-film semiconductor devices such as thin-film transistors and thin-film diodes are classified into amorphous devices and crystalline devices, depending on the kind of silicon used. Since amorphous silicon is inferior in physical characteristics such as field mobility and conductivity to crystalline silicon, crystalline semiconductor devices are required in order to obtain excellent operating characteristics.

However, to crystallize a silicon film, a high temperature exceeding 600° C. is needed. Also, it takes a long time to crystallize the film. Where crystalline silicon devices are mass-produced in practice, several crystallizing machines are required. Consequently, huge investment in equipment results in increased costs.

SUMMARY OF THE INVENTION

It is an object of the present invention to provide a method of fabricating a semiconductor device by crystallizing a silicon film below 600° C. in a substantially negligibly short time. In the present invention, a trace amount of catalytic material is added to a substantially amorphous silicon film to promote crystallization and to lower the crystallization temperature, thus shortening the crystallization time. Adequate examples of the catalytic material include metal elements such as nickel (Ni), iron (Fe), cobalt (Co), and platinum, and compounds such as silicides. In particular, a film, particles, clusters, or the like containing any one of these elements form a layer on or under an amorphous silicon film so as to be in intimate contact with this amorphous silicon film. Alternatively, any one of these elements is implanted into an amorphous silicon film by ion implantation and then the film is thermally annealed at an appropriate temperature to crystallize the film.

When the amorphous silicon film is formed by CVD, the catalytic material is added to the raw material gas. When the amorphous silicon film is formed by physical vapor deposition such as sputtering, the catalytic material is added to the target or evaporation source which forms a film. Of course, as the anneal temperature rises, the crystallization time decreases. Furthermore, as the concentrations of nickel, iron, cobalt, and platinum are increased, the crystallization temperature drops, and the crystallization time is shortened. Our research has revealed that if the concentration of at least one of these elements is in excess of $1 \times 10^{17}$ cm$^{-3}$, favorable results are obtained. Preferably, the concentrations of these elements are determined, using the minimum values in the film measured by SIMS (secondary ion mass spectroscopy).

Since all of the aforementioned catalytic materials are not desirable for silicon, it is desired their concentrations be made as low as possible. Our research has shown that the total concentration of these catalytic materials is preferably not in excess of $1 \times 10^{20}$ cm$^{-3}$. To improve the characteristics further, the surface of the silicon film which has been crystallized by thermal annealing is etched to a depth of 20 to 200Å or to a depth of not more than 50% of the thickness of the silicon film, preferably between 1/100 and 1/5 of the thickness of the silicon film, because excessive portions of these catalytic materials tend to be deposited on the surface. The surface cleaned in this way is coated with an insulating film by a CVD method such as plasma CVD, photo-assisted CVD, or LPCVD or a physical vapor deposition method such as sputtering, the insulating film consisting mainly of silicon oxide. As a result, the clean interface is preserved. If necessary, phosphorus or other element may be added to the insulating film. This semiconductor-insulating film structure can be directly used for a MOS structure. Where TFTs were fabricated by the method described above, leakage current (OFF current) decreased, and the sub threshold characteristics were improved.

Other objects and features of the invention will appear in the course of the description thereof, which follows.

DETAILED DESCRIPTION OF THE INVENTION

EXAMPLE 1

Figure 1A:
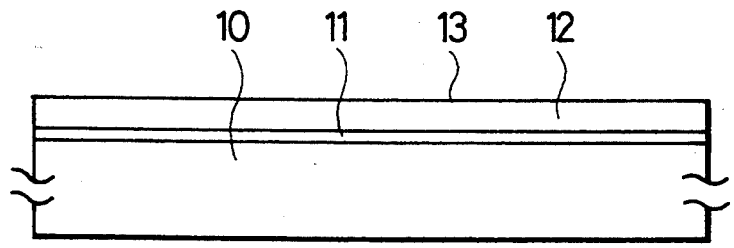
FIGS. 1(A) to 1(E) are cross-sectional views of TFTs, illustrating steps for manufacturing the TFTs according to Example 1 of the present invention.
Figure 1B:
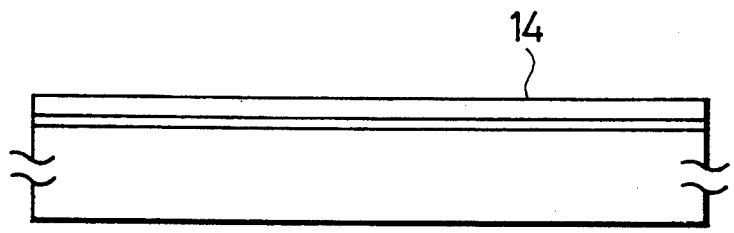
Figure 1C:
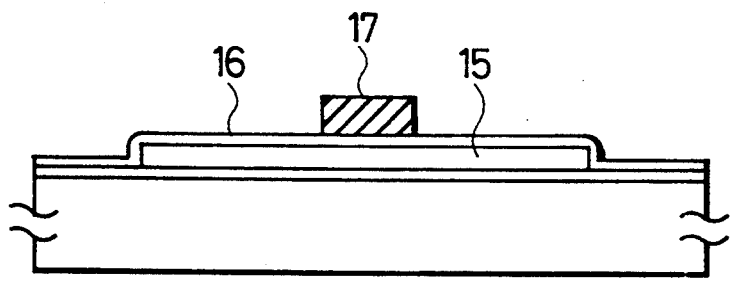
Figure 1D:
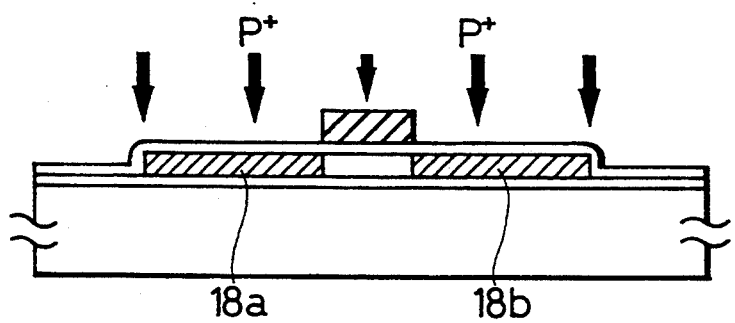
Figure 1E:
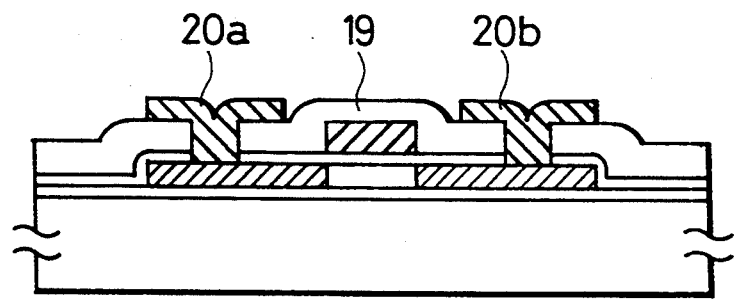

FIG. 1, (A)–(E), are cross-sectional views of TFTs, illustrating steps for fabricating the TFTs according to the present example. In the present example, two kinds of TFTs were fabricated. First, silicon oxide was sputtered as a base film 11 to a thickness of 2000Å on a substrate 10 made of Corning 7059. An amorphous silicon film 12 having a thickness of 500 to 1500Å, e.g., 800Å, was formed on the silicon oxide film 11 by plasma CVD. Subsequently, nickel silicide was deposited as a film 13 having a thickness of 5 to 200Å, e.g., 20Å, by sputtering (FIG. 1(A)). The nickel silicide film 13 is given by the chemical formula NiSi$_x$;

$$0.4 \leq x \leq 2.5, \text{ e.g., } x = 2.0$$

The laminate was annealed at 500° C. for four hours in a reducing ambient to crystallize the amorphous silicon film. Up to this step, the two TFTs were treated in the same way. The surface of one TFT was etched to a depth of 20 to 200Å, e.g., 100Å, with an etchant containing hydrofluoric acid. In this way, a clean surface 14 was exposed. The other TFT was merely cleaned with pure water and not etched (FIG. 1(B)).

Thereafter, the two TFTs underwent the same steps. The obtained silicon film was photolithographically patterned to form island regions 15. Silicon oxide was sputtered as a gate-insulating film 16 having a thickness of 1000Å. A target consisting of silicon oxide was used in the sputtering step. In this sputtering step, the substrate temperature was 200° to 400° C., e.g., 350° C. The sputtering ambient contained oxygen and argon. The ratio of the argon to the oxygen was 0 to 0.5, e.g., less than 0.1 (FIG. 1(C)).

Subsequently, silicon containing 0.1 to 2% phosphorus was deposited to a thickness of 6000 to 8000Å, e.g., 6000Å, by LPCVD. Preferably, the steps for forming the silicon oxide film and the silicon film are carried out in succession. The silicon film was patterned to form gate electrodes 17.

Then, phosphorus ions were implanted into the silicon region by plasma ion implantation, using the gate electrodes 17 as a mask. Phosphine (pH) was used as a dopant gas. The accelerating voltage was 60 to 90 kV, e.g., 80 kV. The dose was $1 \times 10^{15}$ to $8 \times 10^{15}$ cm$^{-2}$, e.g., $5 \times 10^{15}$ cm$^{-2}$. As a result, N-type doped regions 18a and 18b were formed (FIG. 1(D)).

Thereafter, the laminate was annealed at 500° C. for four hours to activate the impurities. Since the nickel atoms were diffused into the silicon film, recrystallization was promoted by the anneal, and the doped regions 18a and 18b were activated. Subsequently, an interlayer insulator 19 having a thickness of 6000Å was formed from silicon oxide by plasma CVD. Contact holes were formed in the silicon oxide film 19. Conductive interconnects 20a and 20b were formed from a multi-layer film of titanium nitride and aluminum. Finally, the laminate was annealed at 350° C. for 30 minutes in a hydrogen ambient at 1 atm. Thus, a semiconductor circuit was completed (FIG. 1 (E)).

Figure 2:
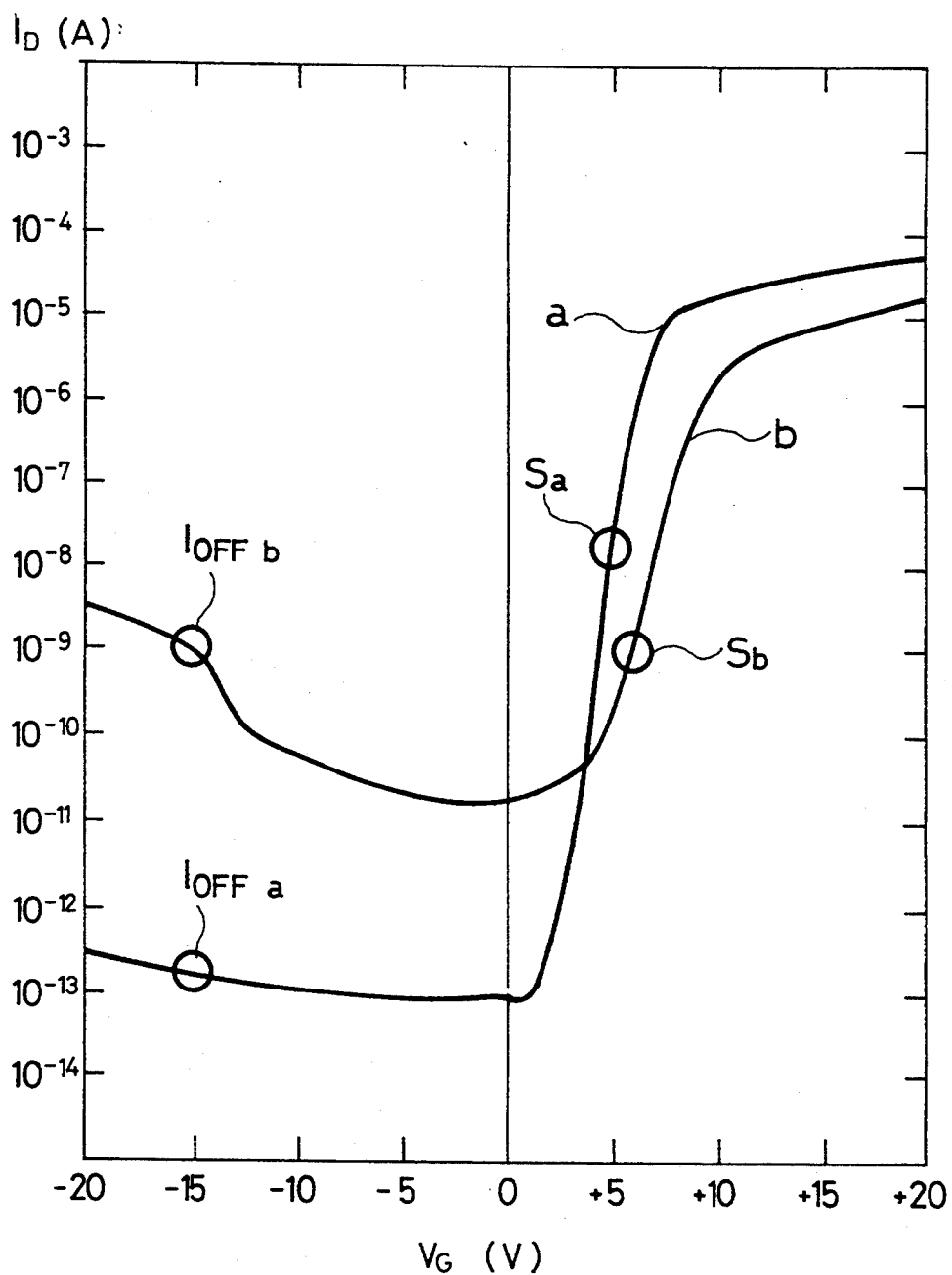
FIG. 2 is a graph showing the characteristics of the TFTs shown in FIGS. 1 (A) to 1(E)
Figure 3A:
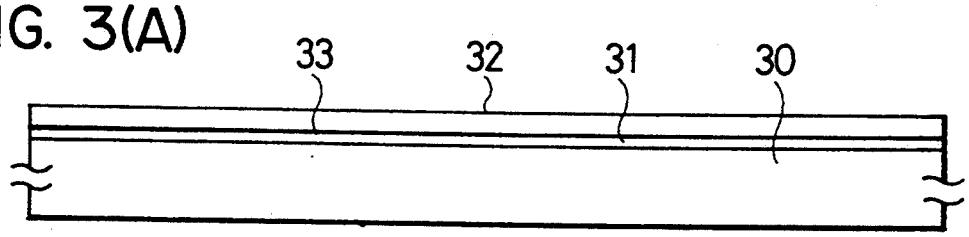
FIGS. 3(A) to 3(E) are cross-sectional views of TFTs, illustrating steps for manufacturing the TFTs according to Example 2 of the present invention.
Figure 3B:
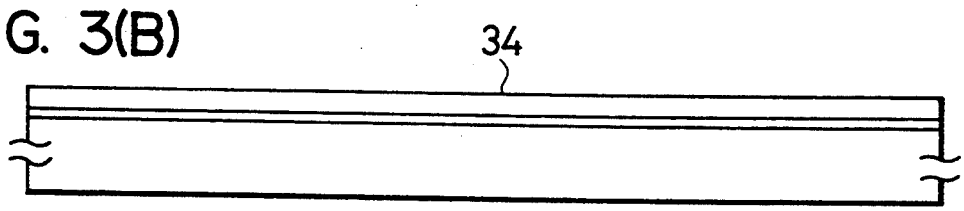
Figure 3C:
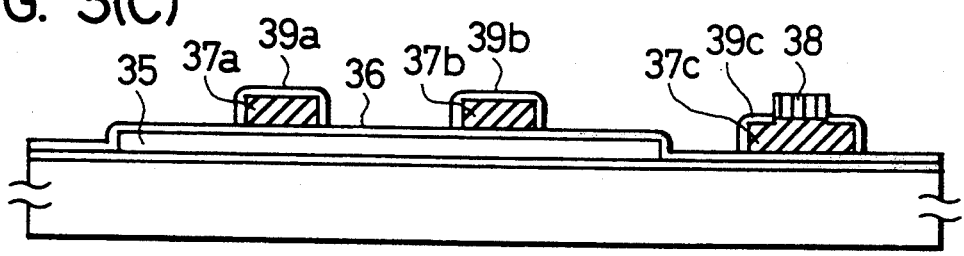
Figure 3D:
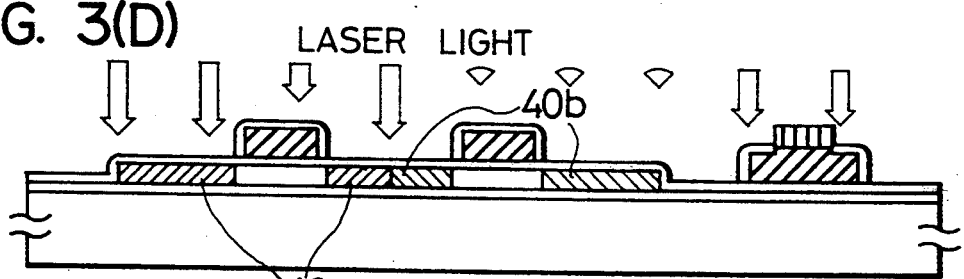
Figure 3E:
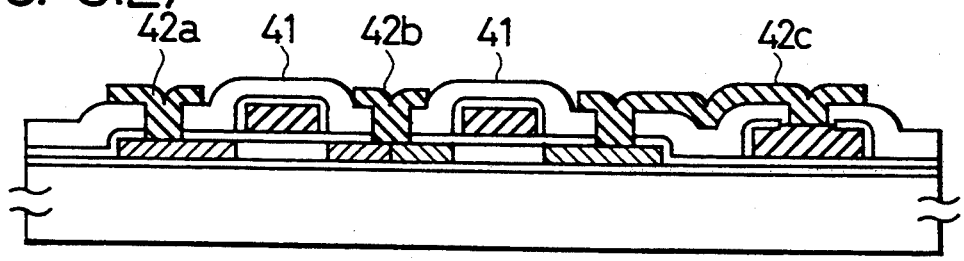

The ID-VG characteristics of the two kinds of TFTs obtained in the present example are shown in FIG. 2. During the measurement, the source-drain voltage was 1 V. Curve a indicates the characteristic of the TFT which was derived by etching the silicon surface to a depth of 100Å, after the crystallization and then forming the silicon oxide film. Curve b indicates the characteristic of the TFT which was fabricated by forming the silicon oxide film immediately after the crystallization. It can be seen from curve a that the leakage current $I_{OFF\,a}$ when a negative voltage was applied to the gate was small, and that a steep rising characteristic ($S_a$) occurred when a positive voltage was applied. Furthermore, the ON/OFF ratio is given by 9 digits. In this way, this device is an ideal field-effect transistor. The device indicated by curve b acts also as a field-effect transistor. However, the leakage current $I_{OFF\,b}$ is larger than the leakage current $I_{OFF\,a}$ of the former device. The rising characteristic ($S_b$) occurring when a positive voltage was impressed is milder. Also, the ON/OFF ratio is given by about 6 digits. The former device has a less threshold voltage than that of the latter device. This suggests that the density of the trap levels existing in the semiconductor film of the former device is smaller. In this manner, the present invention offers TFTs having novel characteristics.

EXAMPLE 2

FIG. 3, (A)-(E), are cross-sectional views of a semiconductor device, illustrating manufacturing steps according to the present invention. Silicon oxide was sputtered as a base film 31 to a thickness of 2000Å, on a substrate 30 made of Corning 7059. Nickel was deposited as a nickel film 33 having a thickness of 5 to 200Å, e.g., 10Å, by electron-beam evaporation. Then, an amorphous silicon film 32 having a thickness of 500 to 1500Å, e.g., 500Å, was deposited by plasma CVD (FIG. 3(A)).

The laminate was annealed at 480° C. for 8 hours to crystallize the amorphous silicon film 32. Then, the surface of the silicon film was lightly etched to a depth of 20 to 200Å with a plasma of carbon tetrachloride (CCl$_4$) or carbon tetrafluoride (CF$_4$). The laminate was subsequently treated at a temperature of 350° to 480° C. for 30 minutes in an ambient containing 1 to 10% hydrogen chloride (HCl). In this way, a clean surface 34 was formed (FIG. 3(B)).

Then, this silicon film was patterned to form island silicon regions 35. A gate-insulating film 36 having a thickness of 1000Å, was fabricated from silicon oxide by plasma CVD which used TEOS (tetraethoxysilane, Si(OC$_2$H$_5$)$_4$ and oxygen as raw materials. Trichloroethylene (C$_2$HCl$_3$) was added to the raw material gases. Before the formation of the film, oxygen was supplied into the chamber at a flow rate of 400 SCCM. A plasma was created at a substrate temperature of 300° C., at a total pressure of 5 Pa, and at an RF power of 150 W. This state was maintained for 10 minutes. Then, oxygen, TEOS, and trichloroethylene were introduced into the chamber at flow rates of 300 SCCM, 15 SCCM, and 2 SCCM, respectively. Under this condition, a silicon oxide film was formed. The substrate temperature was 300° C. The RF power was 75 W. The total pressure was 5 Pa. After the completion of the film, hydrogen was introduced into the chamber at a pressure of 100 torr. The laminate was annealed at 350° C. for 35 minutes in a hydrogen ambient.

Subsequently, aluminum containing 2% silicon was deposited as an aluminum film having a thickness of 6000 to 8000Å, for example 6000Å, by sputtering. Preferably, the silicon oxide film 36 and the aluminum film are formed in succession. The aluminum film was photolithographically patterned to form conductive interconnects 37a, 37b, and 37c. The interconnects 37a and 37b acted as gate electrodes. The surfaces of the aluminum interconnects were anodized to form oxide layers 39a, 39b, and 39c on the surfaces. Before the anodization, a polyimide mask 38 was selectively formed from photosensitive polyimide (Photoneece) on those portions on which contacts would later be formed. During the anodization, no anodic oxide was formed on these portions because of the presence of a mask.

The anodization was conducted in an ethylene glycol solution containing 1 to 5% tartaric acid. The thickness of the obtained oxide layer was 2000Å. Then, phosphorus ions were implanted into the silicon region by plasma ion implantation. Phosphine (PH$_3$) was used as a dopant gas. The accelerating voltage was 60 to 90 kV, for example 80 kV. The dose was $1 \times 10^{15}$ to $8 \times 10^{15}$ cm$^{-2}$, for example $2 \times 10^{15}$ cm$^{-2}$. In this way, N-type doped regions 40a were formed. Only the left TFT, or an N-channel TFT, was masked with a photoresist. Boron ions were implanted into the silicon region of the right TFT, or a P-channel TFT, again by plasma ion implantation. Diborane (B$_2$H$_6$) was used as a dopant gas. The accelerating voltage was 50 to 80 kV, for example 65 kV. The dose was $1 \times 10^{15}$ to $8 \times 10^{15}$ cm$^{-2}$, for example $5 \times 10^{15}$ cm$^{-2}$, which was larger than the dose of the phosphorus previously implanted. In this way, the P-type doped regions 40b were formed.

Then, the impurities were activated by laser annealing. A KrF excimer laser having a wavelength of 248 nm and a pulse duration of 20 nsec was used as the above-described laser. Other lasers such as an XeF excimer laser emitting a wavelength of 353 nm, an XeCl excimer laser emitting a wavelength of 308 nm, and an ArF excimer laser emitting a wavelength of 193 nm may be employed. The energy density of the laser radiation was 200 to 400 mJ/cm$^2$, for example 250 mJ/cm$^2$. Two to ten shots, for example 2 shots, were emitted for each one location. During the laser irradiation, the substrate can be heated to about 200° to 450° C. It is to be noted that the best energy density is varied when the substrate is heated. In the laser illumination step, the polyimide "Photoneece" mask 38 was left behind because the exposed aluminum would be damaged by laser irradiation. This mask 38 can be easily removed by exposing it to an oxygen plasma. As a result, the doped regions 40a and 40b were activated (FIG. 3(D)).

Subsequently, a silicon oxide film 41 was formed from TEOS by plasma CVD to form an interlayer insulator having a thickness of 2000Å. Contact holes were formed in this insulator. Conductive interconnects 42a, 42b, and 42c were formed from a metal material such as a multi-layer film of titanium nitride and aluminum. The interconnects 42c connect the interconnects 37c with one 41 of the doped regions 40b of the right TFT, or a P-channel TFT. In this manner, a semiconductor circuit was completed (FIG. 3(E)).

The semiconductor circuit was completed by the steps described thus far. The characteristics of the fabricated TFTs were by no means inferior to those of TFTs fabricated by the prior art method in which crystallization is carried out by an annealing step at 600° C. We have confirmed that a shift register fabricated according to the present example operates at 11 MHz at a drain voltage of 15 V and at 16 MHz at a drain voltage of 17 V. Furthermore, a reliability test showed that the novel TFTs did not differ in reliability from the TFTs fabricated by the prior art method.

The present invention permits fabrication of TFTs having improved characteristics and improved reliability. In the present invention, as described in connection with Example 2, silicon is crystallized at a low temperature, for example below 500° C., and in a short time, for example 4 hours. In addition, the obtained characteristics and reliability are never inferior to the characteristics and reliability obtained heretofore. Obviously, the throughput is enhanced, and the cost is reduced. Where a conventional 600° C.-process is adopted, the glass substrate shrinks and warps, leading to a decrease in the production yield. The present invention enables execution of a crystallization process below 550° C., which fully solves this problem. This means that a substrate of a large area can be treated simultaneously. That is, the single substrate of a large area is sawn into numerous ICs and hence the cost of each IC can be reduced greatly. In this way, the invention is industrially advantageous.

What is claimed is:

1. A method of fabricating a semiconductor device comprising the steps of:
   forming a silicon film on a substrate;
   forming a substance in contact with said silicon film, said substance containing at least one of nickel, iron, cobalt, and platinum;
   thermally annealing said silicon film;
   etching a surface of said silicon film to a depth of 20 to 200Å after said annealing step;
   forming an insulating film on the silicon film after said etching step; and
   forming a gate electrode on said insulating film.

2. The method of claim 1 wherein said substance comprises a silicide of an element of at least one of nickel, iron, cobalt and platinum.

3. The method of claim 1 wherein said substance comprises NiSi$_x$ where $0.4 \leq x \leq 2.5$.

4. The method of claim 1 wherein said substance has a thickness of 5 to 200 angstroms.

5. The method of claim 1 wherein said etching is carried out by a hydrofluoric acid.

6. A method of fabricating a semiconductor device comprising the steps of:
   forming a silicon film on a substrate, said silicon film containing at least one of nickel, iron, cobalt, and platinum;
   thermally annealing said silicon film;
   etching a surface of said silicon film to a depth of 20 to 200Å after said annealing step;
   forming an insulating film on the silicon film after said etching step; and
   forming a gate electrode on said insulating film.

7. The method of claim 6, wherein at least one of said nickel, iron, cobalt, and platinum is contained in said silicon film at a concentration of $1 \times 10^{17}$ cm$^{-3}$ or higher.

8. The method of claim 6 wherein a total concentration of said nickel, iron, cobalt, and platinum in said silicon film is less than $1 \times 10^{20}$ cm$^{-3}$.

9. The method of claim 7 wherein said concentration is defined as a minimum value measured by secondary ion mass spectroscopy.

10. The method of claim 6 wherein said etching is carried out by a hydrofluoric acid.

11. A method of fabricating a semiconductor device comprising the steps of:
    forming a crystalline silicon film on a substrate, said silicon film containing at least one of nickel, iron, cobalt, and platinum;
    etching a surface of said silicon film to a depth of 20 to 200Å;
    forming an insulating film after said etching step; and
    forming a gate electrode on said insulating film.

12. The method of claim 11 wherein said etching is carried out by a hydrofluoric acid.

13. A method of fabricating a semiconductor device comprising the steps of:
    forming a silicon film on a substrate;
    forming a substance in contact with said silicon film, said substance containing at least one of nickel, iron, cobalt, and platinum;
    thermally annealing said silicon film;
    etching a surface of said silicon film to a depth between one hundredth and one fifth of thickness of said silicon film after said annealing step;
    forming an insulating film on the silicon film after said etching step; and
    forming a gate electrode on said insulating film.

14. The method of claim 13 wherein at least one of said nickel, iron, cobalt, and platinum is contained in said silicon film at a concentration of $1 \times 10^{17}$ cm$^{-3}$ or higher.

15. The method of claim 13 wherein a total concentration of said nickel, iron, cobalt, and platinum in said silicon film is less than $1 \times 10^{20}$ cm$^{-3}$.

16. The method of claim 14 wherein said concentration is defined as a minimum value measured by secondary ion mass spectroscopy.

17. A method of fabricating a semiconductor device comprising the steps of:
   forming a substance containing at least one of nickel, iron, cobalt, and platinum on a substrate;
   forming a silicon film in contact with said substance on said substrate;
   thermally annealing said silicon film;
   etching a surface of said silicon film to a depth of 20 to 200 angstroms after said annealing step;
   forming an insulating film on the silicon film after said etching step; and
   forming a gate electrode on said insulating film.

18. The method of claim 17 wherein said substance has a thickness of 5 to 200 angstroms.

19. The method of claim 17 wherein said etching step is carried out by carbon tetrafluoride or carbon tetrachloride.

20. The method of claim 17 wherein said substance comprises a silicide of an element of at least one of nickel, iron, cobalt, and platinum.

21. A method of fabricating a semiconductor device comprising the steps of:
   forming a silicon film on a substrate;
   forming a substance in contact with said silicon film, said substance containing at least one of nickel, iron, cobalt, and platinum;
   thermally annealing said silicon film;
   etching a surface of said silicon film to a depth of not more than of thickness of said silicon film after said annealing step;
   forming an insulating film on the silicon film after said etching step; and
   forming a gate electrode on said insulating film.

22. The method of claim 1 wherein the silicon film is amorphous.

23. The method of claim 6 wherein the silicon film is amorphous.

24. The method of claim 13 wherein the silicon film is amorphous.

25. The method of claim 17 wherein the silicon film is amorphous.

26. The method of claim 21 wherein the silicon film is amorphous.

* * * * *